(12) United States Patent
Nishitsuji et al.

(10) Patent No.: US 11,936,972 B2
(45) Date of Patent: Mar. 19, 2024

(54) LIGHT SHIELDING PLATE, CAMERA UNIT, AND ELECTRONIC APPARATUS

(71) Applicant: TOPPAN INC., Tokyo (JP)

(72) Inventors: Kiyoaki Nishitsuji, Tokyo (JP); Shinichi Shimamura, Tokyo (JP)

(73) Assignee: TOPPAN INC., Tokyo (JP)

( * ) Notice: Subject to any disclaimer, the term of this patent is extended or adjusted under 35 U.S.C. 154(b) by 253 days.

(21) Appl. No.: 17/575,932

(22) Filed: Jan. 14, 2022

(65) Prior Publication Data

US 2022/0141361 A1    May 5, 2022

Related U.S. Application Data

(63) Continuation of application No. PCT/JP2020/027892, filed on Jul. 17, 2020.

(30) Foreign Application Priority Data

Jul. 19, 2019  (JP) .................................. 2019-134036
Jul. 19, 2019  (JP) .................................. 2019-134037
(Continued)

(51) Int. Cl.
*H04N 23/50* (2023.01)
*C23C 16/30* (2006.01)
(Continued)

(52) U.S. Cl.
CPC ............. *H04N 23/55* (2023.01); *C23C 16/30* (2013.01); *C23F 1/02* (2013.01); *G02B 1/113* (2013.01);
(Continued)

(58) Field of Classification Search
CPC ........ H04N 23/50; H04N 23/51; H04N 23/54; H04N 23/55; H04N 23/57
(Continued)

(56) References Cited

U.S. PATENT DOCUMENTS

2006/0051085 A1    3/2006  Okumura
2011/0109970 A1    5/2011  Abe et al.
(Continued)

FOREIGN PATENT DOCUMENTS

CN    101546132 A    9/2009
JP    2002-229095 A    8/2002
(Continued)

OTHER PUBLICATIONS

Office Action issued in corresponding Chinese Patent Application No. 202080050763.0, dated Apr. 7, 2023.
(Continued)

*Primary Examiner* — Anthony J Daniels
(74) *Attorney, Agent, or Firm* — Foley & Lardner LLP

(57) ABSTRACT

A light shielding plate includes: a front surface located on a light entry side; a rear surface facing away from the front surface; and a hole extending through between the front surface and the rear surface. The hole includes a first hole portion and a second hole portion connected to the first hole portion at a center opening. The first hole portion extends from a rear surface opening in the rear surface to the center opening and is tapered in shape from the rear surface toward the front surface. The second hole portion extends from a front surface opening in the front surface to the center opening and is tapered in shape from the front surface toward the rear surface. The front surface opening is larger in size than the rear surface opening.

12 Claims, 5 Drawing Sheets

(30) Foreign Application Priority Data

| | | | |
|---|---|---|---|
| Jul. 19, 2019 | (JP) | ................................ | 2019-134038 |
| Sep. 13, 2019 | (JP) | ................................ | 2019-167431 |
| Sep. 13, 2019 | (JP) | ................................ | 2019-167432 |
| Sep. 13, 2019 | (JP) | ................................ | 2019-167433 |

(51) Int. Cl.

| | |
|---|---|
| *C23F 1/02* | (2006.01) |
| *G02B 1/113* | (2015.01) |
| *G02B 5/00* | (2006.01) |
| *H04N 23/55* | (2023.01) |
| *H04N 23/51* | (2023.01) |

(52) U.S. Cl.
CPC ............. *G02B 5/005* (2013.01); *H04N 23/50* (2023.01); *H04N 23/51* (2023.01)

(58) Field of Classification Search
USPC ........................................................ 348/374
See application file for complete search history.

(56) References Cited

U.S. PATENT DOCUMENTS

| | | | |
|---|---|---|---|
| 2013/0037695 A1* | 2/2013 | Lee | .................. H01L 27/14625 250/208.1 |
| 2019/0324267 A1* | 10/2019 | Chang | .................... G03B 17/12 |
| 2022/0137270 A1 | 5/2022 | Nishitsuji et al. | |
| 2022/0141361 A1 | 5/2022 | Nishitsuji et al. | |
| 2022/0141362 A1 | 5/2022 | Nishitsuji et al. | |

FOREIGN PATENT DOCUMENTS

| | | |
|---|---|---|
| JP | 2006-72151 A | 3/2006 |
| JP | 2008-257134 A | 10/2008 |
| JP | 2010-008786 A | 1/2010 |
| JP | 2021-018402 A | 2/2021 |
| TW | 200949298 A | 12/2009 |
| WO | WO 2016/060198 A1 | 4/2016 |

OTHER PUBLICATIONS

International Searching Authority, "International Search Report," issued in connection with International Patent Application No. PCT/JP2020/027892, dated Oct. 6, 2020, 5 pages.

International Searching Authority, "Written Opinion," issued in connection with International Patent Application No. PCT/ JP2020/027892, dated Oct. 6, 2020, 4 pages.

International Searching Authority, "International Search Report," issued in connection with International Patent Application No. PCT/JP2020/027893, dated Oct. 6, 2020, 5 pages.

International Searching Authority, "Written Opinion," issued in connection with International Patent Application No. PCT/JP2020/027893, dated Oct. 6, 2020, 3 pages.

Office Action issued in corresponding Taiwanese Patent Application No. 109124325 dated Jun. 25, 2021.

Japanese Office Action issued in connection with JP Appl. Ser. No. 2022-176991 dated May 30, 2023.

* cited by examiner

LIGHT SHIELDING PLATE, CAMERA UNIT, AND ELECTRONIC APPARATUS

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/027892, filed on Jul. 17, 2020, which is based upon and claims the benefit of priority to Japanese Patent Application No. 2019-134036, filed on Jul. 19, 2019; Japanese Patent Application No. 2019-134037, filed on Jul. 19, 2019; Japanese Patent Application No. 2019-134038, filed on Jul. 19, 2019; Japanese Patent Application No. 2019-167431, filed on Sep. 13, 2019; Japanese Patent Application No. 2019-167432, filed on Sep. 13, 2019; and Japanese Patent Application No. 2019-167433, filed on Sep. 13, 2019; the disclosures of which are incorporated herein by reference in their entireties.

TECHNICAL FIELD

The present invention relates to a light shielding plate, a camera unit including the light shielding plate, and an electronic apparatus including the camera unit.

BACKGROUND

A camera unit included in an electronic apparatus such as a smartphone includes a light shielding plate that functions as a diaphragm for external light. Light shielding plates made of resin are often used because light shielding plates having a predetermined shape can easily be formed (for example, refer to Patent Literature (PTL) 1). However, the light shielding plates made of resin are light-transmissive and therefore transmit external light not only through a hole for passing external light, but also through a portion that partitions the hole. Thus, blocking of light by the light shielding plates made of resin is not sufficient, and therefore light shielding plates made of metal with a higher light blocking effect are increasingly being used (for example, refer to PTL 2).
[Citation List] [Patent Literature] [PTL 1] JP 2010-008786 A; [PTL 2] WO 2016/060198

SUMMARY OF THE INVENTION

Technical Problem

When manufacturing light shielding plates made of metal, punching is used to punch a metal plate with a die, because processing is easier and it is possible to manufacture many products per unit time. In processing of the metal plate by punching, the metal plate needs to be punched in a direction orthogonal to a surface of the metal plate in order to inhibit deformation or distortion of the metal plate when the metal plate is punched with a die, to ensure the dimensional accuracy of the products. In this manner, a hole having a side surface extending perpendicularly with respect to the surface of the metal plate in a cross-section of the metal plate orthogonal to the surface thereof is formed in the metal plate.

In the case where the light shielding plate having such a hole is mounted in a camera unit, external light that has entered the light shielding plate in a direction forming an acute angle with the front surface of the light shielding plate may be reflected off the side surface partitioning the hole, ending up passing through the hole. The light having passed through the hole may be received by an imaging unit included in the camera unit, leading to at least one of ghosting and flare in an image captured by the imaging unit. Thus, the light shielding plates made of metal entail new problems attributable to the fact that the light shielding plates are made of metal.

The present invention has an object to provide a light shielding plate, a camera unit, and an electronic apparatus that enable a reduction in the amount of light that is reflected off a side surface partitioning a hole so as to pass through the hole.

Solution to Problem

A light shielding plate for solving the aforementioned problem is a light shielding plate made of metal. The light shielding plate includes: a front surface located on a light entry side; a rear surface facing away from the front surface; and a hole extending through between the front surface and the rear surface. The hole includes a first hole portion and a second hole portion connected to the first hole portion at a central opening. The first hole portion extends from a rear surface opening in the rear surface to the center opening and is tapered in shape from the rear surface toward the front surface. The second hole portion extends from a front surface opening in the front surface to the center opening and is tapered in shape from the front surface toward the rear surface. The front surface opening is larger in size than the rear surface opening. A ratio of a distance between the front surface and an edge of the center opening to a distance between the rear surface and the edge of the center opening in a thickness direction of the light shielding plate is greater than or equal to 2.5.

A camera unit for solving the aforementioned problem includes the light shielding plate.

An electronic apparatus for solving the aforementioned problem includes the camera unit.

With each configuration described above, since the second hole is tapered in shape from the front surface toward the rear surface, light that has entered the hole from diagonally above the front surface is more likely to be reflected off the side surface partitioning the second hole toward the front surface of the light shielding plate, as compared to the case where the width of the second hole is substantially the same across the area from the front surface toward the rear surface. Furthermore, since the ratio of the distance between the front surface and the center opening to the distance between the rear surface and the center opening is greater than or equal to 2.5, the size of the second hole can be maintained at a level that allows the second hole to be tapered in shape from the front surface toward the rear surface. Thus, it is possible to reduce the amount of light that is reflected off the side surface partitioning the hole so as to pass through the hole.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

First Embodiment

With reference to FIGS. 1 to 9, the first embodiment of the light shielding plate, the camera unit, and the electronic apparatus will be described. Hereinafter, the light shielding plate, the method for manufacturing the light shielding plate, and Examples will be described in sequence.

[Light Shielding Plate]

With reference to FIGS. 1 to 5, the light shielding plate will be described.

Figure 1:
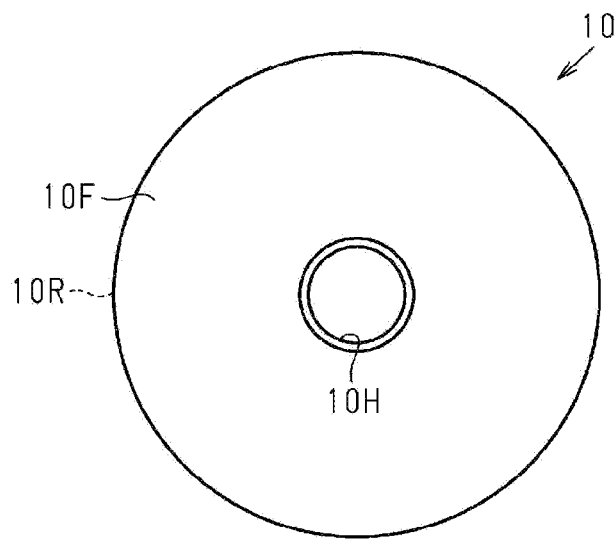
FIG. 1 is a plan view showing the structure of a light shielding plate according to the first embodiment.

As shown in FIG. 1, a light shielding plate 10 made of metal includes a front surface 10F, a rear surface 10R, and a hole 10H. The front surface 10F is located on the light entry side. The rear surface 10R faces away from the front surface 10F. The hole 10H extends between the front surface 10F and the rear surface 10R. The light shielding plate 10 is made of stainless steel, for example, but may be formed of a metal other than stainless steel. Note that in the light shielding plate 10, the front surface 10F, the rear surface 10R, and a side surface partitioning the hole 10H are covered by an antireflection coating not shown in the drawings. The antireflection coating has reflectance lower than the reflectance of the metal forming the light shielding plate 10 and functions to absorb part of light emitted to the antireflection coating. Note that even when the light shielding plate 10 is covered by the antireflection coating, it is not possible to completely eliminate light reflection from the light shielding plate 10.

The light shielding plate 10 is in the shape of a circle corresponding to the shape of a lens that the light shielding plate 10 covers. The hole 10H is in the shape of a circle corresponding to the shape of the lens that the hole 10H faces.

Figure 2:
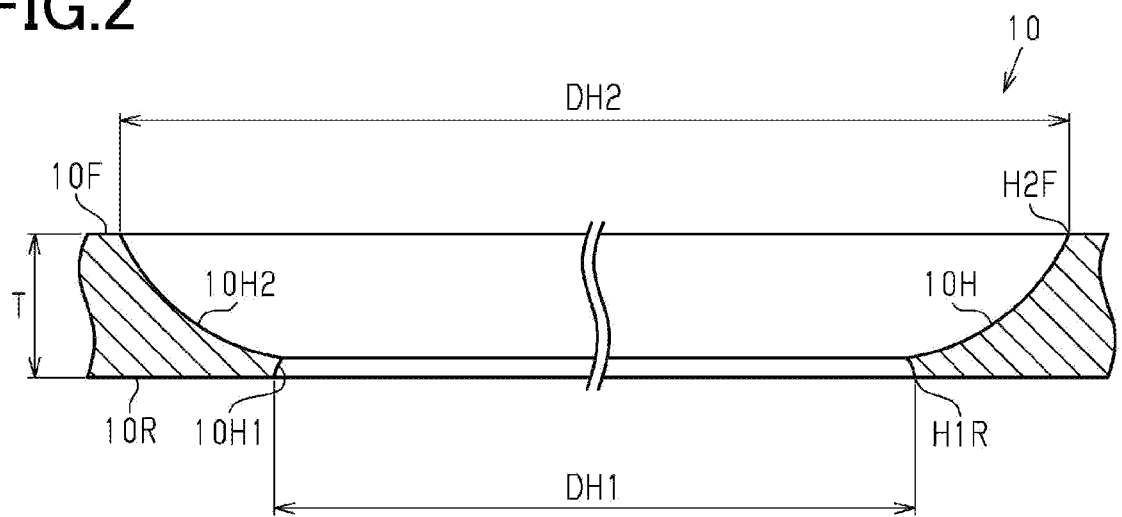
FIG. 2 is a cross-sectional view showing the structure of the light shielding plate shown in FIG. 1.

FIG. 2 shows the structure of the light shielding plate 10 in a cross-section orthogonal to the front surface 10F of the light shielding plate 10.

As shown in FIG. 2, the hole 10H includes a first hole portion 10H1 and a second hole portion 10H2. The first hole portion 10H1 extends from a rear surface opening H1R in the rear surface 10R to a center opening HC (refer to FIG. 3). The first hole portion 10H1 is tapered in shape from the rear surface 10R toward the front surface 10F. The second hole portion 10H2 extends from a front surface opening H2F in the front surface 10F to the center opening HC. The second hole portion 10H2 is tapered in shape from the front surface 10F toward the rear surface 10R. The size of the front surface opening H2F is larger than the size of the rear surface opening H1R. The second hole portion 10H2 is connected to the first hole portion 10H1 at the center opening HC. In other words, the center opening HC is located between the front surface 10F and the rear surface 10R in the thickness direction of the light shielding plate 10.

In the present embodiment, in a cross-section along a plane orthogonal to the front surface 10F, a side surface partitioning the second hole portion 10H2 is arcuate in shape, and the center of curvature of the side surface partitioning the second hole portion 10H2 is located outside the light shielding plate 10. In the cross-section along the plane orthogonal to the front surface 10F, a side surface partitioning the first hole portion 10H1 is arcuate in shape, and the center of curvature of the side surface partitioning the first hole portion 10H1 is located outside the light shielding plate 10.

In the light shielding plate 10, the diameter of the first hole portion 10H1 is a first diameter DH1, and the diameter of the second hole portion 10H2 is a second diameter DH2. The first diameter DH1 is set according to the camera unit on which the light shielding plate 10 is mounted. In the case where the light shielding plate 10 is mounted in a camera unit of a smartphone, for example, the first diameter DH1 may be 0.4 mm or more and 1.0 mm or less. In the case where the light shielding plate 10 is mounted in a vehicle-mounted camera, for example, the first diameter DH1 may be 2.0 mm or more and 7.0 mm or less.

The percentage of the first diameter DH1 with respect to the second diameter DH2 (DH1/DH2×100) may be between 80% or more and 99% or less. In the case where the light shielding plate 10 is mounted in the front of a camera unit of a smartphone, a tablet personal computer, and a laptop personal computer, the camera unit often captures an image of a subject at a short distance. Therefore, the angle of view is large, but the light shielding plate 10 does not need to have a large inner diameter to allow the lens to focus on the subject. Furthermore, due to restrictions on space where the camera unit is disposed, it is difficult to make the outer diameter of the light shielding plate 10 large. Thus, the percentage of the first diameter DH1 with respect to the second diameter DH2 may be 80% or more and 90% or less.

In contrast, in the case where the light shielding plate 10 is mounted in a vehicle-mounted camera, the vehicle-mounted camera often captures an image of a subject at a medium to long distance. Therefore, the angle of view is small, but since there are less restrictions on space where the camera unit is disposed, the diameter of a lens included in the camera unit is large. Thus, in order to collect light in a wide range onto the lens, the ratio of the first diameter DH1 to the second diameter DH2 may be 90% or more and 99% or less, in the light shielding plate 10.

In the case where the light shielding plate 10 is mounted in a camera unit installed on the back of a smartphone, the camera unit often captures an image of a subject at a short to long distance. Therefore, the ratio of the first diameter DH1 to the second diameter DH2 may be between 80% or more and 90% or less, to deal with the case where the angle of view is large, and the ratio of the first diameter DH1 to the second diameter DH2 may be between 90% or more and 99% or less, to deal with the case where the angle of view is small.

A thickness T of the light shielding plate 10 may be between 10 μm or more and 100 μm or less, for example. When the thickness T of the light shielding plate 10 is greater than or equal to 10 μm, the shape of the light shielding plate 10 is less affected by warping of a metal foil for forming the light shielding plate 10. When the thickness T of the light shielding plate 10 is less than or equal to 100 μm, a decrease in the accuracy of etching in forming the hole 10H is reduced.

Figure 3:
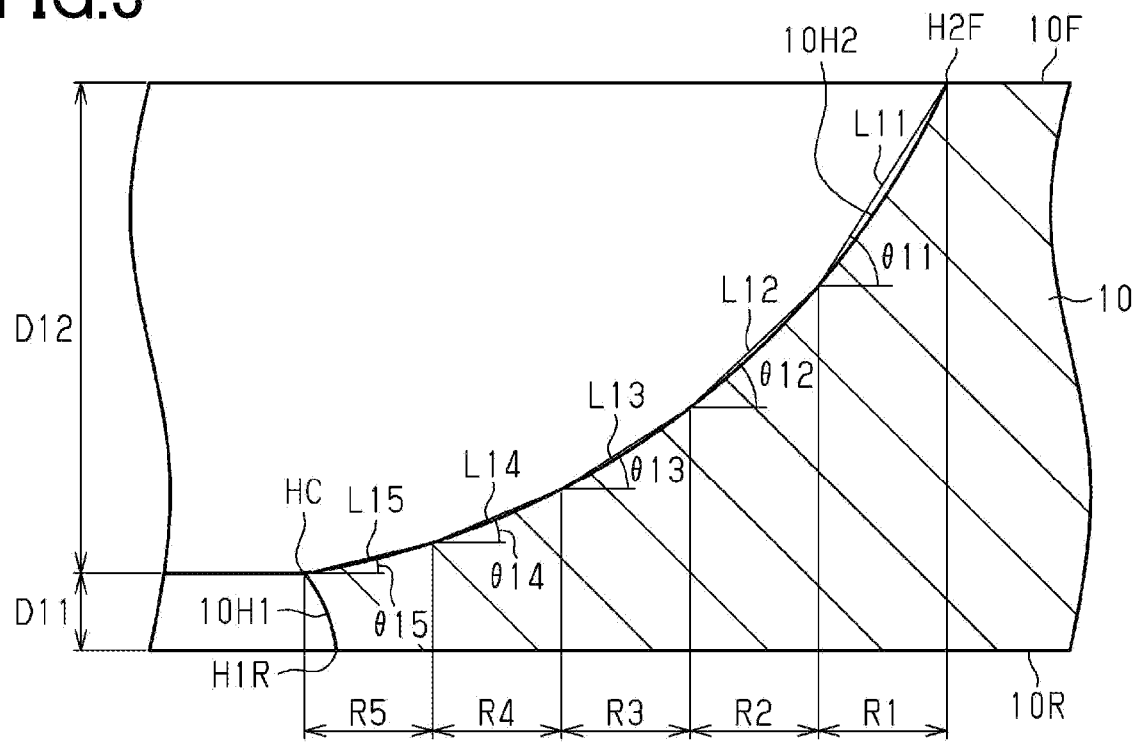
FIG. 3 is a partial enlarged cross-sectional view showing an enlarged view of a portion of the cross-sectional view shown in FIG. 2.

FIG. 3 is an enlarged view of a portion of the cross-section structure of the light shielding plate 10 shown in FIG. 2.

As shown in FIG. 3, the rear surface 10R of the light shielding plate 10 partitions the rear surface opening H1R, and the first hole portion 10H1 is connected to the second hole portion 10H2 at the center opening HC. The distance between the rear surface 10R and an edge of the center opening HC in the thickness direction of the light shielding plate 10 is a first distance D11. The distance between the front surface 10F and the edge of the center opening HC in the thickness of the light shielding plate 10 is a second distance D12. The ratio (D12/D11) of the second distance D12 to the first distance D11 in the light shielding plate 10 is greater than or equal to 2.5.

As the ratio (D12/D11) of the second distance D12 to the first distance D11 increases, the center opening HC relatively approaches the rear surface opening H1R. Thus, the area of the side surface of the first hole portion 10H1 can be reduced. This leads to a reduction in occurrences where part of light that has entered the hole 10H from diagonally above the light shielding plate 10 is reflected off a surface of the lens, then enters the first hole portion 10H1, and is reflected from the first hole portion 10H1 toward a lens LN (refer to FIG. 4).

Note that the ratio (D12/D11) of the second distance D12 to the first distance D11 is preferably as close to infinity as possible. However, in actuality, in etching for forming the hole 10H, an etching solution flows into a gap between the metal foil for forming the light shielding plate 10 and a mask formed on the metal foil, and thus the first hole portion 10H1 having a depth at a submicron level, that is, the first distance D11, is formed. Therefore, for example, when the metal foil is 100 μm thick, the lower limit value of the first distance D11 is approximately 0.1 μm. Therefore, the upper limit value of the ratio (D12/D11) of the second distance D12 to the first distance D11 is approximately 1,000.

The front surface opening H2F is circular in shape as viewed from a viewpoint facing the front surface 10F. A side surface partitioning the second hole portion 10H2 is divided equally into five regions in the radial direction of the front surface opening H2F by faces concentric with respect to the center of the front surface opening H2F, as viewed from the viewpoint facing the front surface 10F. In this case, as viewed from the viewpoint facing the front surface 10F, the side surface partitioning the second hole portion 10H2 includes a first region R1, a second region R2, a third region R3, a fourth region R4, and a fifth region R5 arranged in a direction from the edge of the front surface opening H2F to the edge of the center opening HC. In the side surface partitioning the second hole portion 10H2, the first region R1 includes the edge of the front surface opening H2F. In the side surface partitioning the second hole portion 10H2, the fifth region R5 includes the edge of the center opening HC.

In a cross-section along a plane orthogonal to the front surface 10F, that is, a cross-section along a plane passing through the aforementioned center, the inclination of a straight line connecting one end and the other end of a portion of the side surface partitioning the second hole portion 10H2, that is, a line segment, with respect to the front surface 10F, in each region is a tilt angle of a portion included in the region on the side surface. The angle formed by a first straight line L11 and the front surface 10F in the first region R1 is a first tilt angle $\theta 11$, and the angle formed by a second straight line L12 and the front surface 10F in the second region R2 is a second tilt angle $\theta 12$. The angle formed by a third straight line L13 and the front surface 10F in the third region R3 is a third inclination angle $\theta 13$, the angle formed by a fourth straight line L14 and the front surface 10F in the fourth region R4 is a fourth tilt angle $\theta 14$, and the angle formed by a fifth straight line L15 and the front surface 10F in the fifth region R5 is a fifth tilt angle $\theta 15$.

In the cross-section along the plane orthogonal to the front surface 10F, the first tilt angle $\theta 11$ in the first region R1 is greater than the tilt angles in the other regions on the side surface partitioning the second hole portion 10H2. In other words, the first tilt angle $\theta 11$ in the first region R1 is largest among those in the five regions. The first tilt angle $\theta 11$ is greater than each of the second tilt angle $\theta 12$, the third tilt angle $\theta 13$, the fourth tilt angle $\theta 14$, and the fifth tilt angle $\theta 15$. The first tilt angle $\theta 11$ is 50 degrees or more and 60 degrees or less.

In the cross-section along the plane orthogonal to the front surface 10F, the fifth tilt angle $\theta 15$ in the fifth region R5 is greater than the fourth tilt angle $\theta 14$ on the side surface partitioning the second hole portion 10H2. Furthermore, on the side surface partitioning the second hole portion 10H2, the tilt angles of the portions included in the regions are reduced from the first region R1 toward the fourth region R4. Specifically, on the side surface partitioning the second hole portion 10H2, the tilt angle is reduced in the order from the first tilt angle θ11 to the second tilt angle θ12, to the third tilt angle θ13, and to the fourth tilt angle θ14.

Figure 4:
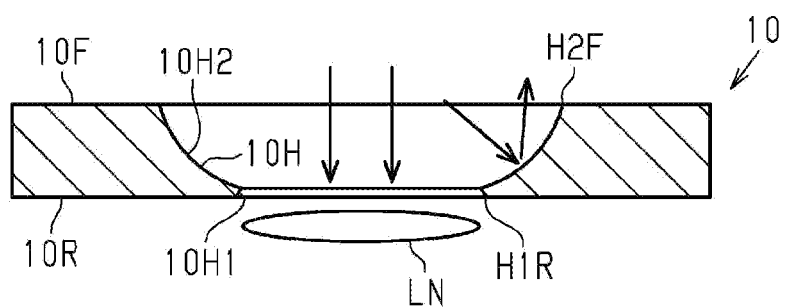
FIG. 4 is a function diagram illustrating how the light shielding plate according to the first embodiment functions.
Figure 5:
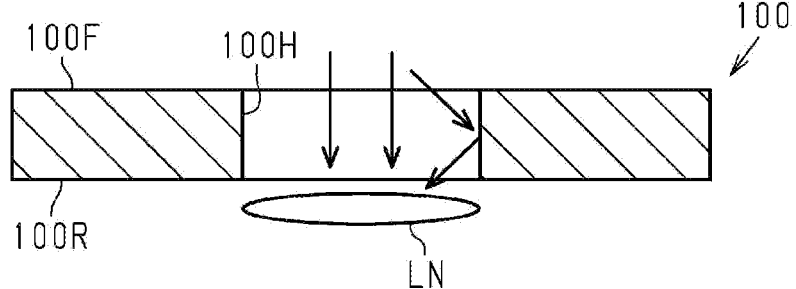
FIG. 5 is a function diagram illustrating how the light shielding plate according to the first embodiment functions.

FIG. 4 shows the cross-section structure of the light shielding plate 10 according to the present embodiment. Meanwhile, FIG. 5 shows a cross-section structure in an example where the side surface partitioning the hole extends orthogonally with respect to the front surface in the cross-section orthogonal to the front surface. For the sake of illustration, the first diameter relative to the thickness of the light shielding plate is reduced in scale in FIGS. 4 and 5.

As shown in FIG. 4, light that has entered the light shielding plate 10 orthogonally with respect to the front surface 10F enters the hole 10H through the front surface opening H2F formed in the front surface 10F. Subsequently, the light that has passed through the hole 10H comes out through the rear surface opening H1R formed in the rear surface 10R and thus reaches the lens LN. On the other hand, in the light shielding plate 10, since the second hole portion 10H2 is tapered in shape from the front surface 10F toward the rear surface 10R, light that has entered the hole 10H from obliquely above the front surface 10F is likely to be reflected off the side surface partitioning the second hole portion 10H2 toward the front surface 10F of the light shielding plate 10.

Furthermore, since the ratio (D12/D11) of the second distance D12 between the front surface 10F and the center opening HC to the first distance D11 between the rear surface 10R and the center opening HC is greater than or equal to 2.5, the size of the second hole portion 10H2 can be maintained at a level that allows the second hole portion 10H2 to be tapered in shape from the front surface 10F toward the rear surface 10R. Thus, it is possible to reduce the amount of light that is reflected off the side surface partitioning the hole 10H so as to pass through the hole 10H. This results in minimization of unintended light entering the lens LN facing the light shielding plate 10.

In the present embodiment, the first tilt angle θ11 in the first region R1 is greater than the tilt angle in each of the second region R2 to the fifth region R5. Therefore, in the regions other than the first region R1, the light can be more likely to be reflected toward the front surface 10F of the light shielding plate 10 while avoiding an excessive increase in the diameter of the second hole portion 10H2. Since the first tilt angle θ11 is 50 degrees or more and 60 degrees or less, the light can be more reliably reflected toward the front surface 10F of the light shielding plate 10, in the first region R1 including the front surface opening H2F, on the side surface partitioning the second hole portion 10H2.

In the present embodiment, since the fifth tilt angle θ15 in the fifth region R5 is greater than the fourth tilt angle θ14 in the fourth region R4, an increase in the diameter of the second hole portion 10H2 can be minimized as compared to the case where the fifth tilt angle θ15 in the fifth region R5 is less than the fourth tilt angle θ14 in the fourth region R4. Furthermore, since the tilt angles in the regions are reduced from the first region R1 toward the fourth region R4, the light incident on the second hole portion 10H2 is more likely to be reflected toward the front surface 10F of the light shielding plate 10 as the distance to the center opening HC is reduced, compared to the case where the side surface partitioning the second hole portion 10H2 has the same inclination in the first region R1 to the fourth region R4.

Light that has entered the second hole portion 10H2 from obliquely above the front surface 10F is reflected off an arcuate side surface having a center of curvature outside the light shielding plate 10. Therefore, specular reflection with the highest brightness of the reflected light is light reflected in a direction from the arcuate side surface toward the front surface 10F of the light shielding plate 10. This leads to a further reduction in the amount of light that is reflected off the side surface partitioning the hole 10H so as to pass through the hole 10H.

The side surface of the light shielding plate 10 that partitions the first hole portion 10H1 is arcuate in shape with the center of curvature outside the light shielding plate 10. Therefore, it is possible to reduce the amount of light that is reflected off the side surface partitioning the hole 10H, near the rear surface opening H1R, out of the light that has entered the hole from diagonally above the front surface 10F, as compared to the case where the side surface partitioning the first hole portion 10H1 is linear. Thus, the amount of light that is reflected off the side surface partitioning the hole 10H so as to pass through the hole can be further reduced.

As shown in FIG. 5, light that has entered a light shielding plate 100 orthogonally with respect to a front surface 100F enters a hole 100H through an opening formed in the front surface 100F, as with the light that has entered the light shielding plate 10 orthogonally with respect to the front surface 10F. Subsequently, the light that has passed through the hole 100H comes out through an opening formed in a rear surface 100R and thus reaches the lens LN. On the other hand, part of the light that has entered the front surface 100F from obliquely above the front surface 100F enters the hole 100H through the opening formed in the front surface 100F and is reflected off the side surface partitioning the hole 100H. Most of the light incident on the side surface is reflected in the specular direction, and therefore the light incident on the side surface is reflected off the side surface toward the lens LN. This causes unintended light to enter an imaging unit through the lens LN.

The aforementioned camera unit includes one or more light shielding plates 10 described above. The camera unit including the light shielding plate 10 is mounted in various electronic apparatuses. Examples of the electronic apparatus including the camera unit may include a smartphone, a tablet personal computer, and a laptop personal computer.

[Method for Manufacturing the Light Shielding Plate]

With reference to FIGS. 6 to 9, the method for manufacturing the light shielding plate 10 will be described. Each of FIGS. 6 to 9 shows the cross-section structure of the metal foil in a specific step in the process of manufacturing the light shielding plate 10. In FIGS. 6 to 9, for the sake of illustration, the ratio of the second diameter DH2 to the thickness of the metal foil is smaller in scale than that in an actual light shielding plate and the ratio of the first diameter DH1 to the thickness of the metal foil is smaller than that in an actual light shielding plate. Furthermore, in FIGS. 6 to 9, for the sake of illustration, the ratio of the first diameter DH1 to the second diameter DH2 is smaller than that in an actual light shielding plate. FIGS. 6 to 9 show only steps related to formation of the hole 10H of the light shielding plate 10 among steps for manufacturing the light shielding plate 10, for the sake of illustration.

Figure 6:
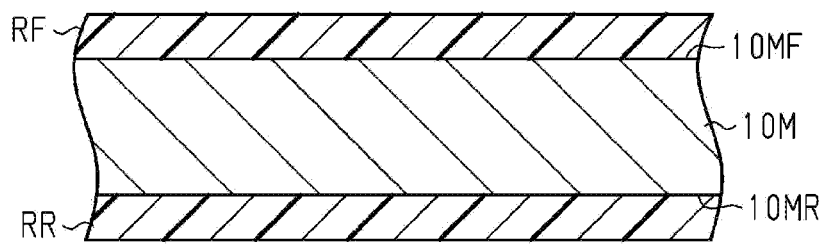
FIG. 6 is a process diagram illustrating a method for manufacturing the light shielding plate according to the first embodiment.

As shown in FIG. 6, at the time of forming the light shielding plate 10, a metal foil 10M for forming the light shielding plate 10 is prepared first. The metal foil 10M is a stainless steel foil, for example, but may be a metal foil formed of a metal other than stainless steel as mentioned above. The thickness of the metal foil 10M is 10 μm or more and 100 μm or less. When the thickness of the metal foil 10M is greater than or equal to 10 the shape of the light shielding plate 10 is less affected by warping of the metal foil 10M. When the thickness of the metal foil 10M is less than or equal to 100 a decrease in the accuracy of etching in forming the hole 10H is reduced. The thickness of the metal foil 10M is substantially the same as the thickness of the light shielding plate 10 manufactured from the metal foil 10M.

Subsequently, a resist layer is disposed on a front surface 10MF and a rear surface 10MR of the metal foil 10M. The front surface 10MF of the metal foil 10M corresponds to the front surface 10F of the light shielding plate 10, and the rear surface 10MR of the metal foil 10M corresponds to the rear surface 10R of the light shielding plate 10. A front surface resist layer RF is disposed on the front surface 10MF of the metal foil 10M, and a rear surface resist layer RR is disposed on the rear surface 10MR of the metal foil 10M. Dry film resists may be attached to the resist layers RF, RR on both the front surface 10MF and the rear surface 10MR. Alternatively, the resist layers RF and RR may be formed on both the front surface 10MF and the rear surface 10MR using a coating solution for forming the resist layers RF and RR. The resist layers RF and RR may be formed by negative resists or may be formed by positive resists.

Figure 7:
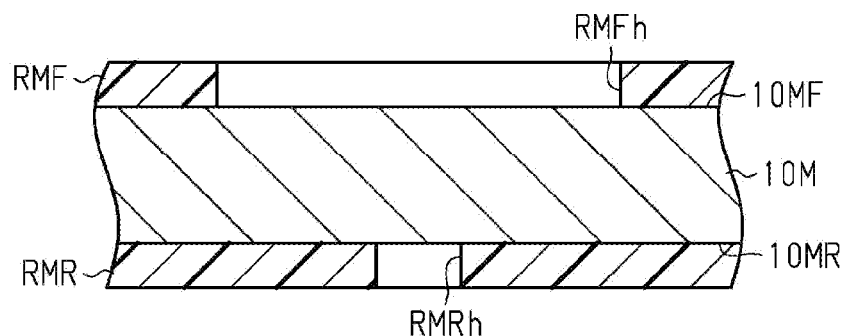
FIG. 7 is a process diagram illustrating the method for manufacturing the light shielding plate according to the first embodiment.

As shown in FIG. 7, resist masks are formed from the resist layers by exposure and development of the resist layers RF and RR. More specifically, a front surface mask RMF is formed from the front surface resist layer RF by exposure and development of the front resist layer RF. Furthermore, a rear surface mask RMR is formed from the rear surface resist layer RR by exposure and development of the rear resist layer RR. The front surface mask RMF has a mask hole RMFh for forming the second hole portion in the metal foil 10M. The rear surface mask RMR has a mask hole RMRh for forming the first hole portion in the metal foil 10M.

Figure 8:
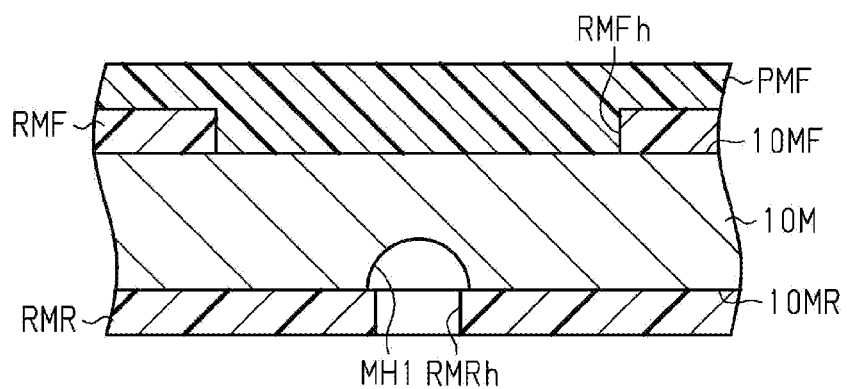
FIG. 8 is a process diagram illustrating the method for manufacturing the light shielding plate according to the first embodiment.

As shown in FIG. 8, using the rear surface mask RMR formed on the rear surface 10MR, a first hole portion MH1 having a rear surface opening in the rear surface 10MR and tapered in shape from the rear surface 10MR toward the front surface 10MF is formed in the metal foil 10M. The first hole portion MH1 corresponds to the first hole portion 10H1 of the light shielding plate 10. At this time, the metal foil 10M is etched using an etching solution that allows etching of the metal foil 10M. Before etching the metal foil 10M, the front surface mask RMF is covered with a front surface protective coating PMF which is resistant to the etching solution. The front surface protective coating PMF may fill or cover the mask hole RMFh of the front surface mask RMF. As a result of the front surface mask RMF being covered by the front surface protective coating PMF, the front surface 10MF of the metal foil 10M is kept from being etched at the same time as the rear surface 10MR of the metal foil 10M.

In the case where the first hole portion MH1 is formed by etching the rear surface 10MR, the first hole portion MH1 having a depth greater than the aforementioned distance between the rear surface 10R and the center opening HC in the light shielding plate 10 is formed.

Figure 9:
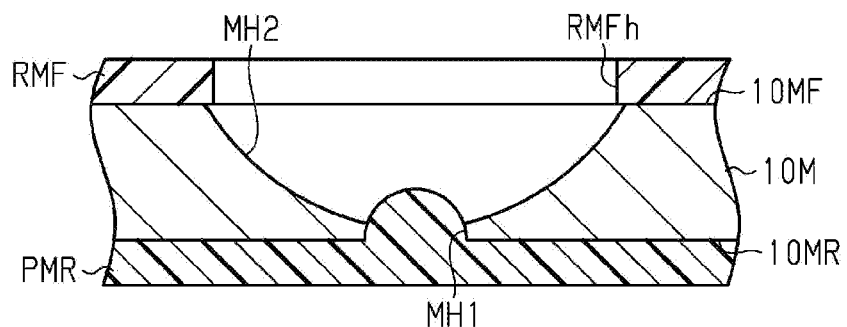
FIG. 9 is a process diagram illustrating the method for manufacturing the light shielding plate according to the first embodiment.

As shown in FIG. 9, after the first hole portion MH1 is formed, using the front surface mask RMF formed on the front surface 10MF, a second hole portion MH2 having a front surface opening in the front surface 10MF and tapered in shape from the front surface 10MF toward the rear surface 10MR is formed in the metal foil 10M so as to connect to the first hole portion MH1. The second hole portion MH2 corresponds to the second hole portion 10H2 of the light shielding plate 10. At this time, as in the case of forming the first hole portion MH1, the metal foil 10M is etched using an etching solution that allows etching of the metal foil 10M. The rear surface mask RMR is removed from the rear surface 10MR of the metal foil 10M before the metal foil 10M is etched.

Furthermore, before the metal foil 10M is etched, a rear surface protective coating PMR resistant to the etching solution covers the rear surface 10MR of the metal foil 10M and fills the first hole portion MH1. As a result of the rear surface 10MR of the metal foil 10M being covered by the rear surface protective coating PMR, the rear surface 10MR of the metal foil 10M is kept from being etched at the same time as the front surface 10MF of the metal foil 10M.

In etching of the second hole portion MH2, the front surface 10MF of the metal foil 10M is etched in the state where the first hole portion MH1 is filled with the rear surface protective coating PMR. Therefore, after the etching of the front surface 10MF reaches the rear surface protective coating PMR, supply of the etching solution to the metal foil 10M is controlled by the rear surface protective coating PMR. Thus, even in the case where the range of the thickness of the metal foil 10M is as wide as 10 μm or more, but 100 μm or less, a cross-section contour accuracy in the contour of the second hole portion MH2 viewed in a cross-section can be improved. In contrast, if the first hole portion MH1 is not filled with the rear surface protective coating PMR, when the first hole portion MH1 and the second hole portion MH2 are connected to form a through-hole in the metal foil 10M, the etching solution leaks toward the rear surface 10MR of the metal foil 10M through the connection between the first hole portion MH1 and the second hole portion MH2. As a result, an accuracy in the shape of the first hole portion MH1 and an accuracy in the shape of the second hole portion MH2 are degraded.

After the first hole portion MH1 and the second hole portion MH2 are formed, the front surface mask RMF is removed from the front surface 10MF, and the rear surface protective coating PMR is removed from the rear surface 10MR. Furthermore, after the front surface mask RMF and the rear surface protective coating PMR are removed from the metal foil 10M, the antireflection coating is formed covering the front surface 10MR, the rear surface 10MR, and the side surface partitioning the first hole portion MH1 and the second hole portion MH2. As mentioned above, the antireflection coating has reflectance lower than the reflectance of the metal foil 10M and functions to absorb part of light incident on the antireflection coating.

The antireflection coating may be a black coating, for example. The antireflection coating may be formed on the metal foil 10M using film formation methods such as a sputtering method or vapor deposition method. Alternatively, the metal foil 10M may be brought into contact with a liquid for forming the antireflection coating, to form the antireflection coating on the metal foil 10M.

By such a method for manufacturing the light shielding plate 10, the light shielding plate 10 is manufactured which has one hole 10H and the ratio of the distance between the front surface 10F and the edge of the center opening HC to the distance between the rear surface 10R and the edge of the center opening HC in the thickness direction of the light shielding plate 10 is greater than or equal to 2.5.

In the above-described method for manufacturing the light shielding plate 10, the rear surface mask RMR may not be removed before the rear surface protective coating PMR is formed. In this case, it is sufficient that the rear surface protective coating PMR covering the rear surface mask RMR and filling the first hole portion MH1 be formed. Furthermore, it is sufficient that the rear surface protective coating PMR be removed from the rear surface 10MR together with the rear surface mask RMR after the second hole portion MH2 is formed by etching the front surface 10MF.

EXAMPLES

Examples and comparative examples will be described.

Example 1-1

A 30-μm thick stainless steel foil was prepared. Subsequently, the first hole portion was formed by etching the stainless steel foil from the rear surface thereof, and then the second hole portion was formed by etching the stainless steel foil from the front surface thereof. This resulted in a light shielding plate having a hole including the first hole portion and the second hole portion, having a long axis diameter of 270 μm and a short axis diameter of 75 μm at the center opening, and including the center opening in the shape of an ellipse.

Example 1-2

A light shielding plate in Example 1-2 was obtained by substantially the same method as in Example 1-1 except that the center opening in Example 1-1 was changed into the shape of a circle having a diameter of 850 μm.

Example 1-3

A light shielding plate in Example 1-3 was obtained by substantially the same method as in Example 1-1 except that the center opening in Example 1-1 was changed into the shape of a circle having a diameter of 490 μm.

Example 1-4

A light shielding plate in Example 1-4 was obtained by substantially the same method as in Example 1-1 except that the center opening in Example 1-1 was changed into the shape of a circle having a diameter of 6,600 μm.

Example 1-5

A light shielding plate in Example 1-5 was obtained by substantially the same method as in Example 1-1 except that the center opening in Example 1-1 was changed into the shape of a circle having a diameter of 2,510 μm.

Example 1-6

A light shielding plate in Example 1-6 was obtained by substantially the same method as in Example 1-3 except that the thickness of the stainless steel foil in Example 1-3 was changed into 25 μm.

Comparative Example 1-1

A light shielding plate in Comparative Example 1-1 was obtained by substantially the same method as in Example 1-2 except that a circular hole penetrating the stainless steel foil was formed by punching through the stainless steel foil with a die. The diameters of the front surface opening and the rear surface opening of the light shielding plate in Comparative Example 1-1 were the same, and were the same as the second diameter in Example 1-2.

[Evaluation Results]

The profile of the second hole portion of each of the light shielding plates in Examples 1-1 to 1-6 and Comparative Example 1-1 was measured in a direction facing the front surface using a confocal laser microscope (VK-X1000 series manufactured by KEYENCE CORPORATION). Furthermore, the profile of the second hole portion was measured in a direction facing the rear surface using the confocal laser microscope (the same one mentioned earlier). Subsequently, the ratio (D12/D11) of the second distance D12 to the first distance D11 was calculated based on the profile of the first hole portion and the profile of the second hole portion. The ratio of the second distance D12 to the first distance D11 was as shown in Table 1 below. Table 1 does not include the ratio of the second distance D12 to the first distance D11 in Comparative Example 1 because the light shielding plate in Comparative Example 1 does not have the hole including the first hole portion and the second hole portion as mentioned above.

TABLE 1

|  | D12/D11 |
| --- | --- |
| Example 1-1 | 3.84 |
| Example 1-2 | 3.35 |
| Example 1-3 | 2.61 |
| Example 1-4 | 2.90 |
| Example 1-5 | 2.57 |
| Example 1-6 | 84.65 |

As shown in Table 1, the ratio of the second distance D12 to the first distance D11 was found to be 3.84 in Example 1-1, 3.35 in Example 1-2, and 2.61 in Example 1-3. Furthermore, the ratio of the second distance D12 to the first distance D11 was found to be 2.90 in Example 1-4, 2.57 in Example 1-5, and 84.65 in Example 1-6. Thus, in every example, the ratio of the second distance D12 to the first distance D11 was found to be not less than 2.5.

Furthermore, based on the profile of the second hole portion, the side surface of the second hole portion was divided equally into five regions along the radius of the front surface opening and the tilt angle in each region was calculated in the imaging result of each of the light shielding plates. The calculation results were as shown in Tables 2 and 3 below. In Tables 2 and 3, the horizontal distance is the length of each region in the radial direction of the front surface opening. Furthermore, in Tables 2 and 3, the difference in elevation is the difference in position between one end and the other end of each region in the thickness direction of the light shielding plate.

TABLE 2

| | Example 1-1 | | | Example 1-2 | | | Example 1-3 | | |
|---|---|---|---|---|---|---|---|---|---|
| | Horizontal distance (μm) | Difference in elevation (μm) | Inclination angle (°) | Horizontal distance (μm) | Difference in elevation (μm) | Inclination angle (°) | Horizontal distance (μm) | Difference in elevation (μm) | Inclination angle (°) |
| First region | 6.5 | 10.7 | 58.7 | 9.5 | 11.4 | 50.2 | 8.1 | 11.0 | 53.6 |
| Second region | 6.7 | 4.9 | 36.2 | 9.5 | 4.3 | 24.6 | 8.1 | 4.0 | 26.5 |
| Third region | 6.5 | 3.0 | 24.8 | 9.6 | 2.8 | 16.0 | 8.1 | 2.5 | 17.2 |
| Fourth region | 6.7 | 2.6 | 21.3 | 9.6 | 1.9 | 10.9 | 8.1 | 1.9 | 13.3 |
| Fifth region | 6.7 | 2.6 | 21.4 | 9.5 | 2.7 | 15.8 | 8.1 | 2.3 | 15.8 |

TABLE 3

| | Example 1-4 | | | Example 1-5 | | | Example 1-6 | | |
|---|---|---|---|---|---|---|---|---|---|
| | Horizontal distance (μm) | Difference in elevation (μm) | Inclination angle (°) | Horizontal distance (μm) | Difference in elevation (μm) | Inclination angle (°) | Horizontal distance (μm) | Difference in elevation (μm) | Inclination angle (°) |
| First region | 7.2 | 10.9 | 56.8 | 6.9 | 10.3 | 56.2 | 7.7 | 11.0 | 54.7 |
| Second region | 7.2 | 4.1 | 29.9 | 7.1 | 4.1 | 30.2 | 7.7 | 4.6 | 31.0 |
| Third region | 7.2 | 2.8 | 21.4 | 6.9 | 2.4 | 19.0 | 7.6 | 2.9 | 21.0 |
| Fourth region | 7.2 | 2.0 | 15.6 | 7.1 | 2.0 | 16.2 | 7.7 | 2.3 | 16.5 |
| Fifth region | 7.2 | 2.5 | 19.2 | 7.1 | 2.8 | 21.5 | 7.7 | 2.4 | 17.5 |

As shown in Tables 2 and 3, in Example 1-1, the horizontal distance in each region was set to 6.5 μm or 6.7 μm, and thus the side surface partitioning the second hole portion was divided equally into five regions in the radial direction of the front surface opening. In Example 1-2, the horizontal distance in each region was set to 9.5 μm or 9.6 μm, and thus the side surface partitioning the second hole portion was divided equally into five regions along the radius of the front surface opening. In Example 1-3, the horizontal distance in each region was set to 8.1 μm, and in Example 1-4, the horizontal distance in each region was set to 7.2 μm; thus, the side surface partitioning the second hole portion was divided equally into five regions along the radius of the front surface opening. In Example 1-5, the horizontal distance in each region was set to 6.9 μm or 7.1 μm, and thus the side surface partitioning the second hole portion was divided equally into five regions along the radius of the front surface opening. In Example 1-6, the horizontal distance in each region was set to 7.7 μm or 7.6 μm, and thus the side surface partitioning the second hole portion was divided equally into five regions along the radius of the front surface opening.

As shown in Tables 2 and 3, in each of Example 1-1 and Example 1-6, the first tilt angle θ11 in the first region was found to be largest among those in the first to fifth regions, and the first tilt angle θ11 was 50 degrees or more and 60 degrees or less. Furthermore, in each of Example 1-1 and Example 1-6, the tilt angle was sequentially reduced from the first tilt angle θ11 to the fourth tilt angle θ14, and the fifth tilt angle θ15 was greater than the fourth tilt angle θ14.

Using camera units including the respective light shielding plates, images of the same object were captured in the same environment. In the images captured using the camera units including the respective light shielding plates in Examples 1-1 to 1-6, almost no ghosting and flare were found. Thus, it was found that setting the ratio (D12/D11) of the second distance D12 to the first distance D11 to 2.5 or more leads to a reduction in ghosting and flare. Especially, in Example 1-6, ghosting and flare were found to be reduced more than in Examples 1-1 to 1-5. In Example 1-6, as compared to Examples 1-1 to 1-5, the area of the side surface of the first hole portion is very small, meaning that it is possible to significantly reduce the occurrence of portion of light incident on the lens being reflected off a surface of the lens, entering the first hole portion, and being further reflected by the first hole portion toward the lens; it is considered that further reductions in ghosting and flare were seen for this reason. In contrast, an image captured by a camera unit including the light shielding plate in Comparative Example 1-1 was found to include ghosting and flare.

As described above, according to the first embodiment of the light shielding plate, the camera unit, and the electronic apparatus, the following advantageous effects can be obtained.

(1-1) In the light shielding plate 10, since the second hole portion 10H2 is tapered in shape from the front surface 10F toward the rear surface 10R, light that has entered the hole 10H from obliquely above the front surface 10F is likely to be reflected off the side surface partitioning the second hole portion 10H2 toward the front surface 10F of the light shielding plate 10.

(1-2) Since the ratio (D12/D11) of the second distance D12 between the front surface 10F and the center opening HC to the first distance D11 between the rear surface 10R and the center opening HC is greater than or equal to 2.5, the size of the second hole portion 10H2 can be maintained at a level that allows the second hole portion 10H2 to be tapered in shape from the front surface 10F toward the rear surface 10R. Thus, it is possible to reduce the amount of light that is reflected off the side surface partitioning the hole 10H so as to pass through the hole 10H.

(1-3) When the first tilt angle θ11 in the first region R1 is greater than the inclination angle in each of the second region R2 to the fifth region R5, the light can be more likely to be reflected toward the front surface 10F of the light shielding plate 10, in the regions other than the first region R1, while avoiding an excessive increase in the diameter of the second hole portion 10H2.

(1-4) When the first tilt angle θ11 is between 50 degrees and 60 degrees, inclusive, the light can be more reliably reflected toward the front surface 10F of the light shielding plate 10, in the first region R1 including the front surface opening H2F, on the side surface partitioning the second hole portion 10H2.

(1-5) When the fifth tilt angle θ15 in the fifth region R5 is greater than the fourth tilt angle θ14 in the fourth region R4, an increase in the diameter of the second hole portion 10H2 can be minimized as compared to the case where the fifth tilt angle θ15 in the fifth region R5 is less than the fourth tilt angle θ14 in the fourth region R4.

(1-6) When the tilt angles in the regions are reduced from the first region R1 toward the fourth region R4, the light incident on the second hole portion 10H2 is more likely to be reflected toward the front surface 10F of the light shielding plate 10 as the distance to the center opening HC is reduced.

(1-7) When the side surface partitioning the second hole portion 10H2 is arcuate in shape with the center of curvature outside the light shielding plate 10, specular reflection with the highest brightness of the reflected light is light reflected in a direction from the arcuate side surface toward the front surface 10F of the light shielding plate 10.

(1-8) When the side surface partitioning the first hole portion 10H1 is arcuate in shape with the center of curvature outside the light shielding plate 10, it is possible to reduce the amount of light that is reflected off the side surface partitioning the hole 10H, near the rear surface opening H1R, of the light that has entered the hole from diagonally above the front surface 10F.

Note that the first embodiment described above can be implemented with the following modifications.

[First Hole Portion]
The side surface partitioning the first hole portion 10H1 may be linear in the cross-section along the plane orthogonal to the front surface 10F. Even in this case, when the first hole portion 10H1 is tapered in shape from the rear surface 10R toward the front surface 10F, the second hole portion 10H2 is tapered in shape from the front surface 10F toward the rear surface 10R, and the ratio of the second distance D12 to the first distance D11 is greater than or equal to 2.5, an advantageous effect equivalent to that in (1-1) described above can be obtained.

[Second Hole Portion]
The side surface partitioning the second hole portion 10H2 may be linear in the cross-section along the plane orthogonal to the front surface 10F. Even in this case, when the first hole portion 10H1 is tapered in shape from the rear surface 10R toward the front surface 10F, the second hole portion 10H2 is tapered in shape from the front surface 10F toward the rear surface 10R, and the ratio of the second distance D12 to the first distance D11 is greater than or equal to 2.5, an advantageous effect equivalent to that in (1-1) described above can be obtained.

[Side Surface Partitioning Second Hole Portion]
The tilt angles in the regions may be sequentially reduced from the first region R1 to the fifth region R5. Even in this case, when the ratio of the second distance D12 to the first distance D11 is greater than or equal to 2.5, an advantageous effect equivalent to that in (1-1) described above can be obtained.

The tilt angles in the regions may not be sequentially reduced from the first region R1 to the fourth region R4. For example, in the first region R1 to the fourth region R4, the tilt angle in each region may be equal to the tilt angle in another region. Even in this case, when the ratio of the second distance D12 to the first distance D11 is greater than or equal to 2.5, an advantageous effect equivalent to that in (1-1) described above can be obtained.

The fifth tilt angle θ15 in the fifth region R5 may be smaller than the fourth tilt angle θ14 in the fourth region R4. Even in this case, when the ratio of the second distance D12 to the first distance D11 is greater than or equal to 2.5, an advantageous effect equivalent to that in (1-1) described above can be obtained.

The first tilt angle θ11 in the first region R1 may be less than 50 degrees and may be greater than 60 degrees. Even in this case, when the ratio of the second distance D12 to the first distance D11 is greater than or equal to 2.5, an advantageous effect equivalent to that in (1-1) described above can be obtained.

The first tilt angle θ11 in the first region R1 may be smaller than the tilt angle in at least one of the second region R2 to the fifth region R5. Even in this case, when the ratio of the second distance D12 to the first distance D11 is greater than or equal to 2.5, an advantageous effect equivalent to that in (1-1) described above can be obtained.

[Light Shielding Plate]
The light shielding plate 10 may be formed of a metal other than stainless steel, as mentioned above. The light shielding plate 10 may be made of an iron-nickel alloy or may be made of an iron-nickel-cobalt alloy, for example.

The coefficient of thermal expansion of an iron-nickel alloy is smaller than the coefficient of thermal expansion of stainless steel. Therefore, a light shielding plate made of an iron-nickel alloy is resistant to deformation dependent on a change in outside air temperature and can thus reduce a change in the amount of incident outside light that occurs with a change in outside air temperature caused by warping of the light shielding plate itself or by a change in the inner diameter of the light shielding plate due to thermal expansion and contraction thereof. The amount of incident outside light is the amount of outside light entering the lens through the light shielding plate 10. Thus, forming the light shielding plate 10 of an iron-nickel alloy is effective in reducing ghosting and flare that occur due to a change in the amount of incident outside light.

The iron-nickel alloy is an alloy including iron and nickel as primary components in which, for example, nickel accounts for at least 30% by mass while iron accounts for the rest. Among iron-nickel alloys, an alloy including 36% by mass of nickel, that is, invar, is preferable as a material for forming the light shielding plate 10. In invar which includes 36% by mass of nickel, the rest of the invar may contain additional materials other than iron that is the primary component. Examples of the additional materials include chromium, manganese, carbon, and cobalt. The additional materials contained in the iron-nickel alloy accounts for no more than 1% by mass at a maximum.

The coefficient of thermal expansion of an iron-nickel-cobalt alloy is smaller than the coefficient of thermal expansion of an iron-nickel alloy. Therefore, the light shielding plate made of an iron-nickel-cobalt alloy is more resistant to deformation dependent on a change in outside air temperature and can thus further reduce a change in the amount of incident outside light that occurs with a change in outside air temperature caused by warping of the light shielding plate itself or by a change in the inner diameter of the light shielding plate due to thermal expansion and contraction thereof. Thus, forming the light shielding plate 10 of an iron-nickel-cobalt alloy is more effective in reducing ghosting and flare that occur due to a change in the amount of incident outside light.

The iron-nickel-cobalt alloy is an alloy including iron, nickel, and cobalt as primary components in which, for example, nickel accounts for at least 30% by mass, cobalt accounts for at least 3% by mass, and iron accounts for the rest. Among iron-nickel-cobalt alloys, an alloy including 32% by mass of nickel and 4% to 5% by mass of cobalt, that is, super invar, is preferable as a material for forming the light shielding plate 10. In super invar which includes 32% by mass of nickel and 4% to 5% by mass of cobalt, the rest of the super invar may contain additional materials other than iron that is the primary component. Examples of the additional materials include chromium, manganese, and carbon. The additional materials contained in the iron-nickel-cobalt alloy accounts for no more than 0.5% by mass at a maximum.

In the case where the light shielding plate 10 is made of an iron-nickel alloy or an iron-nickel-cobalt as described above, the following advantageous effects can be obtained.

(1-9) The deformation of the light shielding plate 10 dependent on a change in outside air temperature can be reduced, and thus a change in the amount of incident outside light that occurs with a change in outside air temperature can be reduced. Therefore, the occurrence of ghosting and flare with a change in the amount of incident outside light can be reduced.

Second Embodiment

Figure 10:
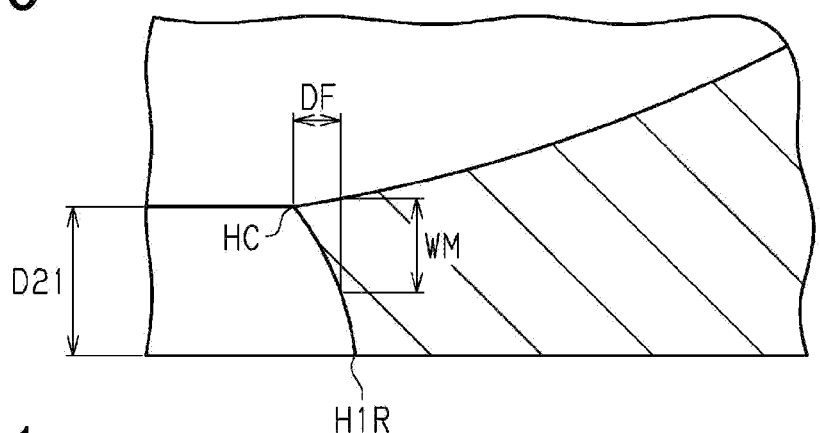
FIG. 10 is a partial enlarged cross-sectional view showing an enlarged view of a portion of a cross-sectional view of a light shielding plate according to the second embodiment.
Figure 11:
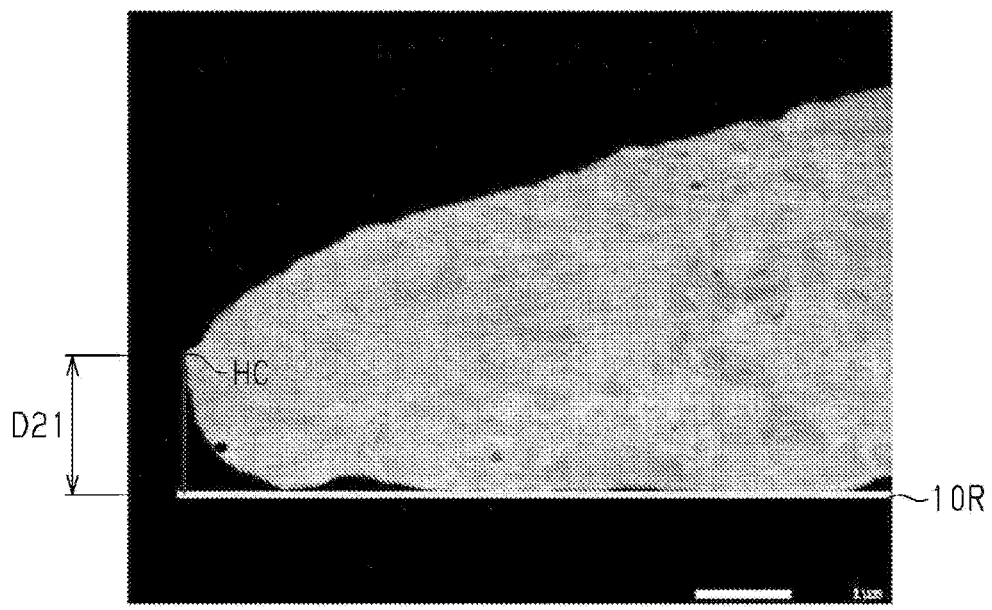
FIG. 11 is a captured image of a cross-section structure of a light shielding plate in Example 2-1.

With reference to FIGS. 10 and 11, a second embodiment of the light shielding plate, the camera unit, and the electronic apparatus will be described. The second embodiment is different from the above-described first embodiment in the shape of the light shielding plate. Therefore, the points of difference will be described in detail below, and description of the other points will be omitted. Hereinafter, the light shielding plate and Examples will be described in sequence.

[Light Shielding Plate]

With reference to FIG. 10, the light shielding plate will be described.

FIG. 10 is an enlarged view of a portion of the cross-section structure of the light shielding plate 10 shown in FIG. 2.

As shown in FIG. 10, a maximum width WM indicates the maximum width of the light shielding plate 10 in the thickness direction of the light shielding plate 10 when in focus upon capturing an image of the edge of the center opening HC along the radius of the center opening HC in the state where the edge of the center opening HC is brought into focus under an imaging condition that the depth of field is 0.4 µm. In other words, the maximum width WM is the thickness of the light shielding plate 10 at a point the same distance away from the edge of the center opening HC as the depth of field DF in a direction orthogonal to the thickness of the light shielding plate 10.

The maximum width WM is less than or equal to 7.0 µm. The maximum width WM is at most 30% of the thickness T of the light shielding plate 10. The maximum width WM may be less than or equal to 3.0 µm. The maximum width WM may be greater than or equal to 1.0 µm. The maximum width WM may not meet both the condition of being less than or equal to 7.0 µm and the condition of being at most 30% of the thickness T of the light shielding plate 10 as long as the maximum width WM meets one of these conditions.

The distance between the rear surface 10R and the edge of the center opening HC in the thickness direction of the light shielding plate 10 is an opening distance D21. The opening distance D21 may be greater than 0 but less than or equal to 3 Alternatively, the opening distance D21 may be at most 30% of the thickness of the light shielding plate 10. The opening distance D21 may not meet the condition of being less than or equal to 3 µm while meeting the condition of being at most 30% of the thickness of the light shielding plate 10. The opening distance D21 may be less than the maximum width WM or may be substantially equal to the maximum width WM.

Light that has entered the light shielding plate 10 orthogonally with respect to the front surface 10F enters the hole 10H through the front surface opening H2F formed in the front surface 10F. Subsequently, the light that has passed through the hole 10H comes out through the rear surface opening H1R formed in the rear surface 10R and thus reaches the lens LN. On the other hand, in the light shielding plate 10, since the second hole portion 10H2 is tapered in shape from the front surface 10F toward the rear surface 10R, light that has entered the hole 10H from obliquely above the front surface 10F is likely to be reflected off the side surface partitioning the second hole portion 10H2 toward the front surface 10F of the light shielding plate 10.

Furthermore, since the maximum width WM is less than or equal to 7.0 µm or the maximum width WM is at most 30% of the thickness T of the light blocking board 10, the amount of light that is reflected off the side surface partitioning the hole 10H near the center opening HC can be reduced by reducing the area of the side surface partitioning the hole 10H near the center opening HC. As a result, the amount of light that is reflected off the side surface partitioning the hole 10H so as to pass through the hole 10H can be reduced. When the maximum width WM is less than or equal to 3.0 the amount of light that is reflected off the side surface partitioning the hole 10H near the center opening HC can be further reduced by further reducing the area of the side surface partitioning the hole near the center opening HC.

Furthermore, when the maximum width WM is greater than or equal to 1.0 the deformation around the center opening HC can be reduced due to the thickness of the light shielding plate 10 in a portion including the center opening HC being greater than or equal to 1.0 µm. Thus, it is possible to reduce the fluctuation in the amount of light passing through the light shielding plate 10 through the center opening HC that is caused by deformation of the light shielding plate 10.

Furthermore, as a result of the opening distance D21 being greater than 0 μm, but less than or equal to 3.0 μm or being at most 30% of the thickness of the light blocking board 10, the amount of light that is reflected off the side surface partitioning the first hole portion 10H1 can be reduced by reducing the area of the side surface partitioning the first hole portion 10H1. As a result, the amount of light that is reflected off the side surface partitioning the hole 10H so as to pass through the hole 10H can be reduced.

EXAMPLES

Examples and Comparative Example will be described with reference to FIG. 11.

Example 2-1

A 25-μm thick stainless steel foil was prepared. Subsequently, the first hole portion was formed by etching the stainless steel foil from the rear surface thereof, and then the second hole portion was formed by etching the stainless steel foil from the front surface thereof. Thus, a light shielding plate having a hole including a first hole portion and a second hole portion was obtained.

Example 2-2

A light shielding plate in Example 2-2 was obtained by substantially the same method as in Example 2-1 except that the second diameter of the front surface opening of the second hole portion in Example 2-1 was changed so as to be larger.

Example 2-3

A light shielding plate in Example 2-3 was obtained by substantially the same method as in Example 2-2 except that the second diameter of the front surface opening of the second hole portion in Example 2-2 was changed so as to be smaller.

Comparative Example 2-1

A light shielding plate in Comparative Example 1 was obtained by substantially the same method as in Example 2-1 except that a circular hole penetrating the stainless steel foil was formed by punching through the stainless steel foil with a die. The diameters of the front surface opening and the rear surface opening of the light shielding plate in Comparative Example 2-1 were the same and were the same as the second diameter in Example 2-1.

[Evaluation Results]

The maximum width WM of each of the light shielding plates in Examples 2-1 to 2-3 and Comparative Example 2-1 was measured using a confocal laser microscope (VK-X1000 series manufactured by KEYENCE CORPORATION). At this time, a 50× objective lens was mounted in the confocal laser microscope. Furthermore, in the state where the edge of the center opening was in focus, the side surface was observed in a direction facing the side surface partitioning the hole through the confocal laser microscope, and thus the maximum width WM was measured. The range in focus, that is, the depth of field, of the confocal laser microscope varies depending on the magnification of the objective lens. Furthermore, since an object within the depth of field is in focus, the maximum width in the thickness direction of the light shielding plate varies according to the position of the object relative to the edge of the center opening. Therefore, in actuality, the thickness of the light shielding plate in focus has a predetermined width. The depth of field of the 50× objective lens is 0.4 μm. Thus, the maximum value of the width of the light shielding plate in the thickness direction of the light shielding plate in the state where the depth of field is 0.4 μm and the edge of the center opening is in focus is defined as the maximum width. In other words, the thickness of the light shielding plate measured at a position the same distance away from the edge of the center opening as the depth of field is the maximum with WM of the light shielding plate. The measurement results of the maximum width WM were as shown in Table 4.

A measurement target was created by cutting the light shielding plate in each of Examples 2-1 to 2-3 and Comparative Example 2-1 along the plane orthogonal to the front surface. The result of capturing an image of the measurement target in Example 2-1 among these measurement targets by a scanning electron microscope is as shown in FIG. 11. Furthermore, the result of measuring the opening distance in each of Examples 2-1 to 2-3 and Comparative Example 2-1 is a shown in Table 4. The hole of the light shielding plate in Comparative Example 2-1 does not include the first hole portion, the second hole portion, or the center opening, and thus the maximum width and the opening distance in Comparative Example 2-1 are not shown.

TABLE 4

| | Maximum width WM (μm) | Opening distance D (μm) | Ghosting and flare |
|---|---|---|---|
| Example 2-1 | 2.3 | 0.27 | Very good |
| Example 2-2 | 0.6 | 0.10 | Good |
| Example 2-3 | 6.96 | 7.05 | Fair |
| Comparative Example 2-1 | — | — | Poor |

As shown in Table 4, the maximum width WM in Example 2-1 was found to be 2.3 μm, the maximum width WM in Example 2-2 was found to be 0.6 μm, and the maximum width WM in Example 2-3 was found to be 6.96 μm. Thus, in each of Examples 2-1 to 2-3, the maximum width WM was found to be not greater than 7.0 μm. As shown in Table 4, the opening distance D21 in Example 2-1 was found to be 0.27 μm, the opening distance D21 in Example 2-2 was found to be 0.10 μm, and the opening distance D21 in Example 2-3 was found to be 7.05 μm.

Furthermore, as shown in FIG. 11, in the light shielding plate in Example 2-1, the first hole portion was found to include the rear surface opening H1R and the center opening HC. Each of the light shielding plate in Example 2-2 and the light shielding plate in Example 2-3 was also found to include a hole in the shape equivalent to the shape of the hole of the light shielding plate in Example 2-1.

Using camera units including the respective light shielding plates, images of the same object were captured in the same environment before the formation of the measurement targets from the respective light shielding plates. The images captured by the camera units were evaluated according to the following criteria.

Very good: No ghosting occurs and substantially no flare occurs.

Good: No ghosting occurs and flare occurs to an extent that does not significantly reduce the contrast of the image.

Fair: Ghosting occurs in only a portion of the image and flare occurs to an extent that does not significantly reduce the contrast of the image.

Poor: Ghosting occurs over a wide range of the image and flare that significantly reduces the contrast of the image occurs.

As shown in Table 4, the evaluation result obtained in the case where the light shielding plate in Example 2-1 was used was found to be "Very Good", the evaluation result obtained in the case where the light shielding plate in Example 2-2 was used was found to be "Good", and the evaluation result obtained in the case where the light shielding plate in Example 2-3 was used was found to be "Fair". Furthermore, as shown in Table 4, the evaluation result obtained in the case where the light shielding plate in Comparative Example 2-1 was used was found to be "Poor".

Thus, in Examples 2-1 to 2-3, ghosting and flare were found to be reduced more than in Comparative Example 2-1. Therefore, in Examples 2-1 to 2-3, the amount of light that is reflected off the side surface partitioning the hole so as to pass through the hole of the light shielding plate can be reduced. In Example 2-3, although the amount of light that is reflected off the side surface partitioning the hole so as to pass through the hole of the light shielding plate can be reduced more than in Comparative Example 2-1, ghosting and flare occur. Therefore, the maximum width WM is preferably less than or equal to 7.0 µm. In Example 2-2, although the amount of light that is reflected off the side surface partitioning the hole so as to pass through the hole of the light shielding plate can be reduced more than in Comparative Example 2-1, the amount of light that is reflected off the side surface partitioning the hole so as to pass through the hole of the light shielding plate is considered to be larger than that in Example 2-1. Such a difference in the amount of light is considered to be due to the deformation of the light shielding plate caused by a reduction in the strength thereof, and thus the maximum width WM is preferably greater than or equal to 1.0 µm to reduce the deformation of the light shielding plate.

As described above, according to the second embodiment of the light shielding plate, the camera unit, and the electronic apparatus, the following advantageous effects can be obtained.

(2-1) As a result of the maximum width WM being less than or equal to 7.0 µm, the amount of light that is reflected off the side surface partitioning the hole 10H near the center opening HC can be reduced by reducing the area of the side surface partitioning the hole 10H near the center opening HC. As a result, the amount of light that is reflected off the side surface partitioning the hole 10H so as to pass through the hole 10H can be reduced.

(2-2) As a result of the maximum width WM being less than or equal to 3.0 µm, the amount of light that is reflected off the side surface partitioning the hole 10H near the center opening HC can be further reduced. As a result, the amount of light that is reflected off the side surface partitioning the hole so as to pass through the hole 10H can be reduced.

(2-3) As a result of the maximum width WM being greater than or equal to 1.0 µm, the deformation around the center opening HC can be reduced. Thus, it is possible to reduce the fluctuation in the amount of light passing through the light shielding plate 10 through the center opening HC that is caused by deformation of the light shielding plate 10.

(2-4) As a result of the opening distance D21 being less than or equal to 3.0 µm, the amount of light that is reflected off the side surface partitioning the first hole portion 10H1 can be reduced by reducing the area of the side surface partitioning the first hole portion 10H1. As a result, the amount of light that is reflected off the side surface partitioning the hole 10H so as to pass through the hole 10H can be reduced.

(2-5) As a result of the opening distance D21 being at most 30% of the thickness of the light shielding plate 10, the amount of light that is reflected off the side surface partitioning the first hole portion 10H1 can be reduced by reducing the area of the side surface partitioning the first hole portion 10H1. As a result, the amount of light that is reflected off the side surface partitioning the hole 10H so as to pass through the hole 10H can be reduced.

(2-6) As a result of the maximum width WM being at most 30% of the thickness of the light shielding plate 10, the amount of light that is reflected off the side surface partitioning the hole 10H near the center opening HC can be reduced by reducing the area of the side surface partitioning the hole 10H near the center opening HC. As a result, the amount of light that is reflected off the side surface partitioning the hole 10H so as to pass through the hole 10H can be reduced.

The second embodiment described above can be implemented with the following modifications.

[Opening Distance]

The opening distance D21 may be greater than 3 µm. Even in this case, when the maximum width WM is less than or equal to 7.0 µm, an advantageous effect equivalent to that in (2-1) described above can be obtained. Furthermore, even in this case, when the maximum width WM is at most 30% of the thickness of the light shielding plate 10, an advantageous effect equivalent to that in (2-6) described above can be obtained.

The opening distance D21 may be greater than 30% of the thickness of the light shielding plate 10. Even in this case, when the maximum width WM is less than or equal to 7.0 µm, an advantageous effect equivalent to that in (2-1) described above can be obtained. Furthermore, even in this case, when the maximum width WM is at most 30% of the thickness of the light shielding plate 10, an advantageous effect equivalent to that in (2-6) described above can be obtained.

[Maximum Width]

The maximum width WM may be greater than 0 µm, but less than 1 µm. Even in this case, when the maximum width WM is less than or equal to 7.0 µm, an advantageous effect equivalent to that in (2-1) described above can be obtained. Furthermore, even in this case, when the maximum width WM is at most 30% of the thickness of the light shielding plate 10, an advantageous effect equivalent to that in (2-6) described above can be obtained.

The maximum width WM may be greater than 3.0 µm, but less than or equal to 7.0 µm. Even in this case, an advantageous effect equivalent to that in (2-1) described above can be obtained.

[First Hole Portion]

As long as the first hole portion 10H1 is tapered in shape from the rear surface 10R toward the front surface 10F, the side surface partitioning the first hole portion 10H1 may be linear in the cross-section along the plane orthogonal to the front surface 10F.

[Second Hole Portion]

As long as the second hole portion 10H2 is tapered in shape from the front surface 10F toward the rear surface 10R, the side surface partitioning the second hole portion 10H2 may be linear in the cross-section along the plane orthogonal to the front surface 10F.

[Light Shielding Plate]

The light shielding plate 10 may be formed of a metal other than stainless steel, as mentioned above. The light shielding plate 10 may be formed of any of the metals cited in the modification examples of the first embodiment.

The light shielding plate 10 according to the second embodiment can be provided in combination with a structure included in the light shielding plate 10 according to the first embodiment.

Third Embodiment

Figure 12:
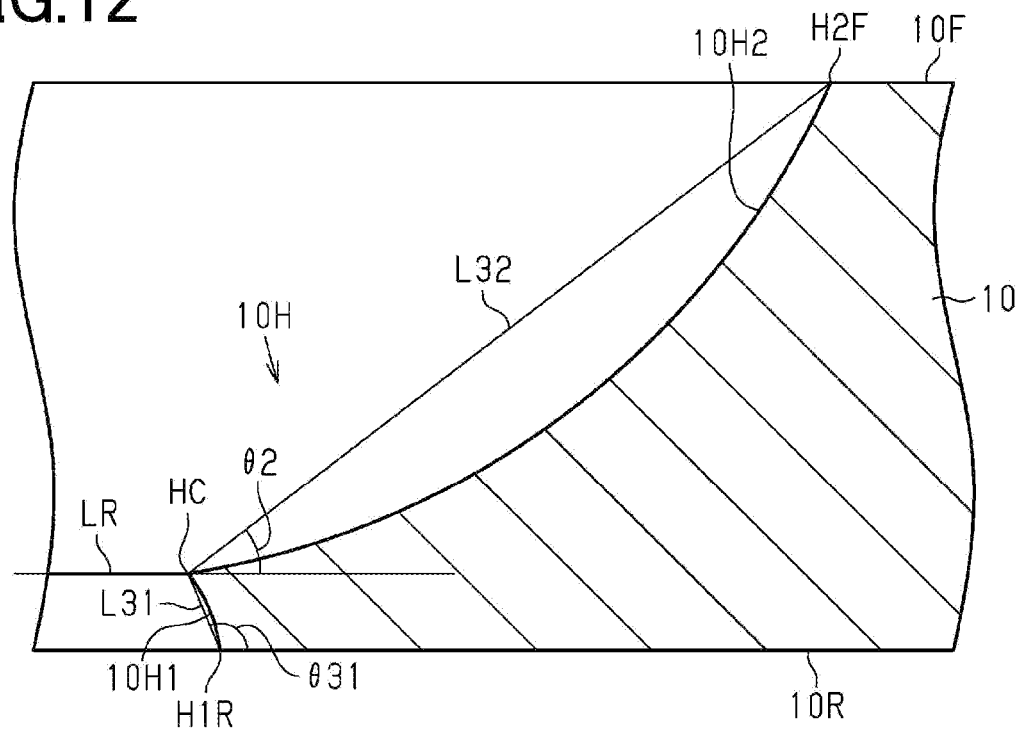
FIG. 12 is a partial enlarged cross-sectional view showing an enlarged view of a portion of a cross-sectional view of a light shielding plate according to the third embodiment.
Figure 13:
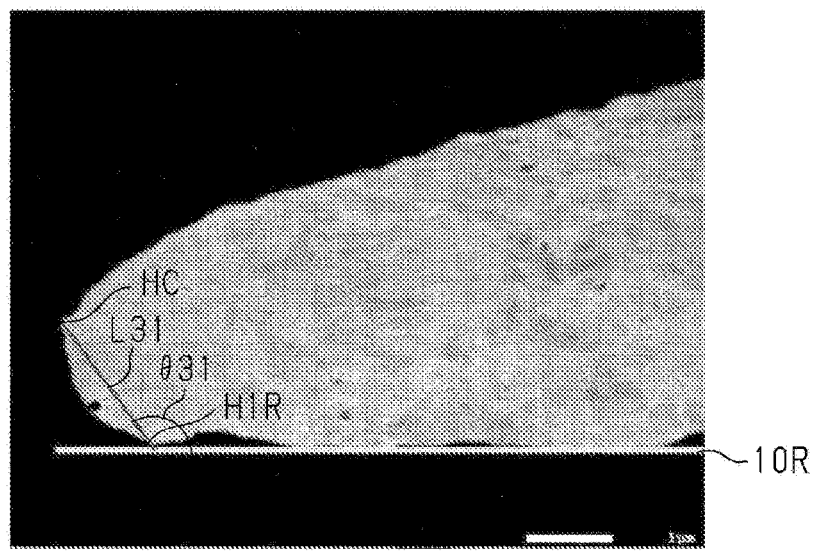
FIG. 13 is a captured image of a cross-section structure of a light shielding plate in Example 3-1.

With reference to FIGS. 12 and 13, a third embodiment of the light shielding plate, the camera unit, and the electronic apparatus will be described. The third embodiment is different from the above-described first embodiment in the shape of the light shielding plate. Therefore, the points of difference will be described in detail below, and description of the other points will be omitted. Hereinafter, the light shielding plate and Examples will be described in sequence.

[Light Shielding Plate]

With reference to FIG. 12, the light shielding plate will be described.

FIG. 12 is an enlarged view of a portion of the cross-section structure of the light shielding plate 10 shown in FIG. 2.

As shown in FIG. 12, in the cross-section along the plane orthogonal to the front surface 10F, a straight line passing through the edge of the center opening HC and the edge of the rear surface opening H1R, that is, a line segment, is a first straight line L31. The angle formed by the first straight line L31 and the rear surface 10R is a first angle $\theta 31$. The first angle $\theta 31$ is greater than 90 degrees. The cross-section along the plane orthogonal to the front surface 10F passes through the center of the front surface opening H2F. Furthermore, in the cross-section along the plane orthogonal to the front surface 10F, the first straight line L31 is the chord of an arc connecting the center opening HC and the rear surface opening H1R.

In the cross-section along the plane orthogonal to the front surface 10F, a straight line passing through the edge of the center opening HC and extending parallel to the rear surface 10R is a reference straight light LR. The shortest straight line connecting the edge of the center opening HC and the edge of the surface opening H2F is a second straight line L32. The angle formed by the reference straight line LR and the second straight line L32 may be 20 degrees or more and 40 degrees or less.

In the case where the light shielding plate 10 is mounted in the front of a camera unit of a smartphone, a tablet personal computer, and a laptop personal computer, the camera unit often captures an image of a subject at a short distance. Therefore, to deal with an increase in the angle of view, the angle formed by the reference straight line LR and the second straight line L32 may be an angle included in the range of 20 degrees to 30 degrees. In the case where the light shielding plate 10 is mounted in a vehicle-mounted camera, the camera unit often captures an image of a subject at a middle to long distance. Therefore, to deal with a decrease in the angle of view, the angle formed by the reference straight line LR and the second straight line L32 is preferably an angle included in the range of 30 degrees to 40 degrees.

In the case where the light shielding plate 10 is mounted in a camera unit installed on the back of a smartphone, the camera unit often captures an image of a subject at a short to long distance. Therefore, the angle formed by the reference straight line LR and the second straight line L32 may be 20 degrees or more and 30 degrees or less, to deal with the case where the angle of view is large, and may be 30 degrees or more and 40 degrees or less, to deal with the case where the angle of view is small.

Light that has entered the light shielding plate 10 orthogonally with respect to the front surface 10F enters the hole 10H through the front surface opening H2F formed in the front surface 10F. Subsequently, the light that has passed through the hole 10H comes out through the rear surface opening H1R formed in the rear surface 10R and thus reaches the lens LN. On the other hand, in the light shielding plate 10, since the second hole portion 10H2 is tapered in shape from the front surface 10F toward the rear surface 10R, light that has entered the hole 10H from diagonally above the front surface 10F is likely to be reflected off the side surface partitioning the first hole portion 10H1 toward the front surface 10F of the light shielding plate 10.

Furthermore, it is possible to reduce the amount of light that is reflected off the side surface partitioning the hole 10H, near the rear surface opening H1R, of the light that has entered the light shielding plate 10 from diagonally above the front surface 10F, as compared to the case where the angle formed by the first straight line L31 and the rear surface 10R is 90 degrees. Thus, the amount of light that is reflected off the side surface partitioning the hole 10H so as to pass through the hole 10H can be reduced. This results in minimization of unintended light entering the lens LN facing the light shielding plate 10.

Light that has entered the second hole portion 10H2 from diagonally above the front surface 10F is reflected off an arcuate side surface. Therefore, specular reflection with the highest brightness of the reflected light is light reflected in a direction from the arcuate side surface toward the front surface 10F of the light shielding plate 10. This leads to a further reduction in the amount of light that is reflected off the side surface partitioning the second hole 10H2 so as to pass through the hole 10H.

The side surface of the light shielding plate 10 that partitions the first hole portion 10H1 is arcuate in shape with the center of curvature outside the light shielding plate 10. Therefore, it is possible to reduce the amount of light that is reflected off the side surface partitioning the hole 10H, near the rear surface opening H1R, out of the light that has entered the hole from diagonally above the front surface 10F, as compared to the case where the side surface partitioning the first hole portion 10H1 is linear. Thus, the amount of light that is reflected off the side surface partitioning the hole 10H so as to pass through the hole can be further reduced.

Furthermore, as compared to the case where the angle formed by the second straight line L32 and the reference straight line LR is greater than 40 degrees, when light traveling from diagonally above the front surface 10F in a direction slightly shifted from a direction orthogonal to the front surface 10F is incident on the side surface partitioning the hole 10H, the light incident on said side surface is likely to be reflected toward the front surface 10F of the light shielding plate 10. This leads to a further reduction in the amount of light that is reflected off the side surface partitioning the hole 10H so as to pass through the hole.

EXAMPLES

Examples and Comparative Examples will be described with reference to FIG. 13.

Example 3-1

A 25-μm thick stainless steel foil was prepared. Subsequently, the first hole portion was formed by etching the stainless steel foil from the rear surface thereof, and then the second hole portion was formed by etching the stainless steel foil from the front surface thereof. Thus, a light shielding plate having a hole including a first hole portion and a second hole portion was obtained. The first diameter of the first hole portion was 490 μm and the second diameter of the second hole portion was 571 μm.

Comparative Example 3-1

A light shielding plate in Comparative Example 3-1 was obtained by substantially the same method as in Example 3-1 except that a circular hole penetrating the stainless steel foil was formed by punching through the stainless steel foil with a die. The diameters of the front surface opening and the rear surface opening of the light shielding plate in Comparative Example 3-1 were the same and were the same as the second diameter in Example 3-1.

Comparative Example 3-2

A light shielding plate in Comparative Example 3-2 was obtained by substantially the same method as in Example 3-1 except that after the formation of the second hole portion without the first hole portion formed, a portion between the bottom of the second hole portion and the rear surface was cut through by a laser beam. The diameter of the front surface opening of the light shielding plate in Comparative Example 3-2 was the same as the second diameter in Example 3-1 and the diameter of the rear surface opening of the light shielding plate in Comparative Example 3-2 was the same as the first diameter in Example 3-1.

[Evaluation Results]

A measurement target was created by punching the light shielding plate in each of Examples 3-1 and Comparative Examples 3-1 and 3-2 along the plane orthogonal to the front surface. The result of capturing an image of the measurement target in Example 3-1 by a scanning electron microscope is as shown in FIG. 13.

As shown in FIG. 13, the first angle θ31 formed by the first straight line L31 and the rear surface 10R of the measurement target in Example 3-1 was found to be 125 degrees, that is, greater than 90 degrees. In contrast, in the measurement target in Comparative Example 3-1, the angle formed by the side surface and the rear surface was found to be 90 degrees at every position on the side surface partitioning the hole. In the measurement target in Comparative Example 3-2, the angle formed by the rear surface and the side surface formed by the laser beam was found to be 90 degrees.

Note that using camera units including the respective light shielding plates, images of the same object were captured in the same environment before the formation of the measurement targets from the respective light shielding plates. In the image captured using the camera unit including the light shielding plate in Example 3-1, no ghosting or flare were found. In contrast, in the image captured by the camera unit including the light shielding plate in Comparative Example 3-1 and the image captured by the camera unit including the light shielding plate in Comparative Example 3-2, at least one of ghosting and flare was found.

As described above, according to the third embodiment of the light shielding plate, the camera unit, and the electronic apparatus, the following advantageous effects can be obtained.

(3-1) The amount of light that is reflected off the side surface partitioning the hole 10H near the rear surface opening H1R can be reduced. Thus, the amount of light that is reflected off the side surface partitioning the hole 10H so as to pass through the hole 10H can be reduced.

(3-2) Light that has entered the second hole portion 10H2 from diagonally above the front surface 10F is reflected off an arcuate side surface. Therefore, specular reflection with the highest brightness of the reflected light is light reflected in a direction from the arcuate side surface toward the front surface 10F of the light shielding plate 10. This leads to a further reduction in the amount of light that is reflected off the side surface partitioning the hole 10H so as to pass through the hole 10H.

(3-3) The side surface of the light shielding plate 10 that partitions the first hole portion 10H1 is arcuate in shape with the center of curvature outside the light shielding plate 10. Therefore, it is possible to reduce the amount of light that is reflected off the side surface partitioning the hole 10H, near the rear surface opening H1R, out of the light that has entered the hole from diagonally above the front surface 10F, as compared to the case where the side surface partitioning the first hole portion 10H1 is linear. Thus, the amount of light that is reflected off the side surface partitioning the hole 10H so as to pass through the hole 10H can be further reduced.

(3-4) As compared to the case where the angle formed by the second straight line L32 and the reference straight line LR is greater than 40 degrees, when light traveling from diagonally above the front surface 10F in a direction slightly shifted from a direction orthogonal to the front surface 10F is incident on the side surface partitioning the hole 10H, the light incident on said side surface is likely to be reflected toward the front surface 10F of the light shielding plate 10. This leads to a further reduction in the amount of light that is reflected off the side surface partitioning the hole 10H so as to pass through the hole 10H.

Note that the third embodiment described above can be implemented with the following modifications.

[Second Angle]

A second angle θ32 formed by the second straight line L32 and the reference straight line LR may be greater than 40 degrees. Even in this case, when the first hole portion 10H1 is tapered in shape from the rear surface 10R toward the front surface 10F, the second hole portion 10H2 is tapered in shape from the front surface 10F toward the rear surface 10R, and the first angle θ31 is greater than 90 degrees, an advantageous effect equivalent to that in (3-1) described above can be obtained.

[First Hole Portion]

The side surface partitioning the first hole portion 10H1 may be linear in the cross-section along the plane orthogonal to the front surface 10F. Even in this case, when the first hole portion 10H1 is tapered in shape from the rear surface 10R toward the front surface 10F, the second hole portion 10H2 is tapered in shape from the front surface 10F toward the rear surface 10R, and the first angle θ31 is greater than 90 degrees, an advantageous effect equivalent to that in (3-1) described above can be obtained.

[Second Hole Portion]

The side surface partitioning the second hole portion 10H2 may be linear in the cross-section along the plane orthogonal to the front surface 10F. Even in this case, when the first hole portion 10H1 is tapered in shape from the rear surface 10R toward the front surface 10F, the second hole portion 10H2 is tapered in shape from the front surface 10F toward the rear surface 10R, and the first angle θ31 is greater than 90 degrees, an advantageous effect equivalent to that in (3-1) described above can be obtained.

[Light Shielding Plate]

The light shielding plate 10 may be formed of a metal other than stainless steel, as mentioned above. The light shielding plate 10 may be formed of any of the metals cited in the modification examples of the first embodiment.

The light shielding plate 10 according to the third embodiment can be provided in combination with at least one of a structure included in the light shielding plate 10 according to the first embodiment and a structure included in the light shielding plate 10 according to the second embodiment.

What is claimed is:

1. A light shielding plate made of metal, comprising:
   a front surface located on a light entry side;
   a rear surface facing away from the front surface; and
   a hole extending through between the front surface and the rear surface, wherein
   the hole includes a first hole portion and a second hole portion connected to the first hole portion at a center opening, the first hole portion extends from a rear surface opening in the rear surface to the center opening and is tapered in shape from the rear surface toward the front surface, the second hole portion extends from a front surface opening in the front surface to the center opening and is tapered in shape from the front surface toward the rear surface, and the front surface opening is larger in size than the rear surface opening, and
   a ratio of a distance between the front surface and an edge of the center opening to a distance between the rear surface and the edge of the center opening in a thickness direction of the light shielding plate is greater than or equal to 2.5.

2. The light shielding plate of claim 1, wherein
   the front surface opening is circular in shape as viewed from a viewpoint facing the front surface, and
   when a side surface partitioning the second hole portion is divided equally into five regions in a radial direction of the front surface opening by circles concentric with a center of the front surface opening as viewed from the viewpoint facing the front surface, in a cross-section along a plane orthogonal to the front surface, among the five regions, a region including an edge of the front surface opening has a greatest inclination with respect to the front surface.

3. The light shielding plate of claim 2, wherein
   in the cross-section along the plane orthogonal to the front surface, among the five regions, the region including the edge of the front surface has an inclination of 50 degrees or more and 60 degrees or less, with respect to the front surface.

4. The light shielding plate of claim 2, wherein
   in the cross-section along the plane orthogonal to the front surface, among the five regions, the region including the edge of the center opening has an inclination greater than an inclination of an adjacent region with respect to the front surface.

5. The light shielding plate of claim 2, wherein
   as viewed from the viewpoint facing the front surface, the five regions are a first region, a second region, a third region, a fourth region, and a fifth region arranged in a direction from the edge of the front surface opening to the edge of the center opening, and
   inclinations of portions included in the first region to the fourth region with respect to the front surface are reduced from the first region toward the fourth region.

6. The light shielding plate of claim 1, wherein
   in a cross-section along a plane orthogonal to the front surface, a side surface partitioning the second hole portion is arcuate in shape, and a center of curvature of the side surface partitioning the second hole portion is located outside the light shielding plate.

7. The light shielding plate of claim 1, wherein
   in a cross-section along a plane orthogonal to the front surface, a side surface partitioning the first hole portion is arcuate in shape, and a center of curvature of the side surface partitioning the first hole portion is located outside the light shielding plate.

8. The light shielding plate of claim 1, wherein
   the light shielding plate has a thickness of 10 μm or more and 100 μm or less.

9. The light shielding plate of claim 1, wherein
   the light shielding plate is made of an iron-nickel alloy or an iron-nickel-cobalt alloy.

10. The light shielding plate of claim 9, wherein
    the light shielding plate is made of invar or super invar.

11. A camera unit, comprising:
    the light shielding plate of claim 1.

12. An electronic apparatus, comprising:
    the camera unit of claim 11.

* * * * *